(12) United States Patent
Sakurada et al.

(10) Patent No.: US 7,214,268 B2
(45) Date of Patent: May 8, 2007

(54) METHOD OF PRODUCING P-DOPED SILICON SINGLE CRYSTAL AND P-DOPED N-TYPE SILICON SINGLE CRYSTAL WAFER

(75) Inventors: Masahiro Sakurada, Fukushima (JP); Izumi Fusegawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 19 days.

(21) Appl. No.: 10/538,878

(22) PCT Filed: Dec. 25, 2003

(86) PCT No.: PCT/JP03/16794

§ 371 (c)(1),
(2), (4) Date: Jun. 14, 2005

(87) PCT Pub. No.: WO2004/065666

PCT Pub. Date: Aug. 5, 2004

(65) Prior Publication Data

US 2006/0065184 A1    Mar. 30, 2006

(30) Foreign Application Priority Data

Jan. 17, 2003    (JP)    ............................. 2003-010436

(51) Int. Cl.
*C30B 15/20*    (2006.01)

(52) U.S. Cl. ............................. 117/19; 117/13; 117/20
(58) Field of Classification Search .................. 117/13, 117/15, 19
See application file for complete search history.

(56) References Cited

FOREIGN PATENT DOCUMENTS

| JP | A 2000-178099 | 6/2000 |
|---|---|---|
| JP | A 2000-351690 | 12/2000 |

OTHER PUBLICATIONS

VORONKOV, "The Mechanism of Swirl Defects Formation in Silicon," *Journal of Crystal Growth*, vol. 59, No. 3, pp. 625-643 (Mar. 1, 1982).
Dupret et al., "Global Modelling of Heat Transfer in Crystal Growth Furnaces," *Int. J. Heat Mass Transfer.*, vol. 33, No. 9, pp. 1849-1871 (Apr. 7, 1998).

*Primary Examiner*—Felisa Hiteshew
(74) *Attorney, Agent, or Firm*—Oliff & Berridge, PLC

(57) ABSTRACT

The present invention is a method of producing a P(phosphorus)-doped silicon single crystal by Czochralski method, wherein, at least, a growth of the single crystal is performed so that an Al (aluminum) concentration is $2\times10^{12}$ atoms/cc or more. Thereby, there can be provided a method of easily and inexpensively producing a P(phosphorus)-doped silicon single crystal of defect-free region having an excellent capability of electrical characteristics to be high breakdown voltage, which contains neither, for example, V region, OSF region, nor large dislocation cluster (LSEPD, LFPD) region.

14 Claims, 4 Drawing Sheets

US 7,214,268 B2

METHOD OF PRODUCING P-DOPED SILICON SINGLE CRYSTAL AND P-DOPED N-TYPE SILICON SINGLE CRYSTAL WAFER

TECHNICAL FIELD

The present invention relates to a method of producing a P-doped silicon single crystal by Czochralski method and a P-doped N-type silicon single crystal wafer. Particularly, the present invention relates to a method of producing a P-doped silicon single crystal of defect-free region having an excellent capability of electrical characteristics to be high breakdown voltage, which contains neither V region, OSF region, nor large dislocation cluster (LSEPD, LFPD) region, and to a P-doped N-type silicon single crystal wafer.

BACKGROUND ART

A single crystal used as a substrate of semiconductor devices, for example, a silicon single crystal, is mainly produced by Czochralski method (hereafter abbreviated to CZ method).

When producing a single crystal by CZ method, for example, a single crystal production apparatus 10 as shown FIG. 2 is used to produce the single crystal. This single crystal production apparatus 10 has a member for containing and melting a raw material polycrystal such as silicon, heat insulation members to insulate heat, and etc. They are installed in a main chamber 11. A pulling chamber 12 extending upwardly is continuously provided from a ceiling portion of the main chamber 11, and a mechanism for pulling a single crystal 13 by a wire 14 (not shown) is provided above it.

In the main chamber 11, a quartz crucible 16 for containing a melted raw material melt 15 and a graphite crucible 17 supporting the quartz crucible 16 are provided, and these crucibles 16 and 17 are supported by a shaft 18 so that they can be rotated and moved upwardly or downwardly by a driving mechanism (not shown). To compensate for decline of the melt level of the raw material melt 15 caused by pulling of the single crystal 13, the driving mechanism for the crucibles 16 and 17 is designed to rise the crucibles 16 and 17 as much as the melt level declines.

And, a graphite heater 19 for melting the raw material is provided so as to surround the crucibles 16 and 17. A heat insulating member 20 is provided outside the graphite heater 19 so as to surround it in order to prevent that the heat from the graphite heater 19 is directly radiated on the main chamber 11.

Moreover, a graphite cylinder 23 is provided above the crucibles, and a heat insulating material 24 is provided on the outside of the lower end of the graphite cylinder 23 so as to oppose to the raw material melt 15 so that the heat radiation from the melt surface is intercepted and the temperature of the raw material melt surface is kept.

A raw material lump is put in the quartz crucible 16 provided in the single crystal production apparatus as described above, the crucible 16 is heated by the graphite heater 19 as described above to melt the raw material lump in the quartz crucible 16. A seed crystal 22 fixed by a seed holder 21 connected with the lower end of the wire 14 is immersed into the raw material melt 15 melted from the raw material lump as described above. Thereafter, the single crystal 13 having a desired diameter and quality is grown under the seed crystal 22 by rotating and pulling the seed crystal 22. In this case, after bringing the seed crystal 22 into contact with the raw material melt 15, so-called necking, once forming the neck portion by narrowing the diameter to about 3 mm, is performed, and then, a dislocation-free crystal is pulled by spreading to a desired diameter.

The silicon single crystal produced by the CZ method as described above is mainly used for producing a semiconductor devices. In these years, with higher integration of semiconductor devices, an element becomes finer. The problem of Grown-in crystal defects introduced during the crystal growth has become more significant as an element has become finer.

Hereafter, the Grown-in crystal defects will be described (see, FIG. 4).

In the silicon single crystal, if the crystal growth rate is relatively high, Grown-in defects such as FPD (Flow Pattern Defect) considered to be originated from voids aggregated of void-type point defects, are present at high density over the region in a crystal radial direction. The region where the defects are present is called V (Vacancy) region. Moreover, if the growth rate is lower, OSF (Oxidation Induced Stacking Fault) region is generated as in a ring shape from the periphery of the crystal with lowering of the growth rate. And defects such as LSEPD (Large Secco Etch Pit Defect) and LFPD (Large Flow Pattern Defect) considered to be originated from dislocation loops aggregated of interstitial silicons in the outside of the ring are present at low density, and the region where the defects are present is called I (Interstitial) region. With further lowering of the growth rate, OSF ring is contracted to disappear in the center of a wafer, and the whole plane becomes I region.

In these years, in the outside of the OSF ring between V region and I region, a region has been discovered where neither such as FPD originated from voids nor such as LSEPD and LFPD originated from interstitial silicons are present. The region is called N (Neutral) region. Moreover, the N region is further categorized as follows. There are Nv region (a region where more voids are present) next to the outside of the OSF ring and Ni region (a region where more interstitial silicons are present) next to I region. In the Nv region, amount of precipitated oxygen is rich when thermal oxidation treatment is performed, and in the Ni region, amount of precipitated oxygen is little.

The Grown-in defects are considered to be determined the introduced amount by the parameter of F/G which is ratio of the pulling rate (F) and an average value of a temperature gradient in the crystal along a pulling axis from the melting point of silicon to 1400° C. (G) (See, for example, V. V. Voronkov, Journal of Crystal Growth, 59 (1982) 625-643). Namely, if the pulling rate and the temperature gradient are controlled so that F/G is constant, a single crystal can be pulled in a desired defect region or in a desired defect-free region (See, for example, Japanese Patent Laid-open (Kokai) Publication No. 2000-178099).

Therefore, it is conventionally necessary to pull a single crystal by controlling the pulling rate etc. for N region so as to obtain a single crystal of defect-free region. It is difficult to control the rate because the single crystal of N region can be grown in a range of a relatively limited pulling rate. Thus, productivity and yield of the single crystal become low. Accordingly, a method of expanding a pulling rate range where a defect-free region can be obtained has been required so as to produce it more easily.

DISCLOSURE OF THE INVENTION

Accordingly, the present invention was conceived in view of the above problems. An object of the present invention is to provide a method of easily and inexpensively producing a P-doped silicon single crystal of defect-free region having an excellent capability of electrical characteristics to be high breakdown voltage, which contains neither, for example, V region, OSF region, nor large dislocation cluster (LSEPD, LFPD) region, and to provide the P-doped N-type silicon single crystal wafer.

In order to accomplish the above object, according to the present invention, there is provided a method of producing a P(phosphorus)-doped silicon single crystal by Czochralski method, wherein, at least, a growth of the single crystal is performed so that an Al (aluminum) concentration is $2\times10^{12}$ atoms/cc or more.

By performing a growth of the P-doped single crystal so that an Al (aluminum) concentration is $2\times10^{12}$ atoms/cc or more as described above, there can be obtained a P-doped silicon single crystal in which a region at a lower rate side from N region is a defect-free I region containing no large dislocation clusters such as LFPD and LSEPD. Therefore, because the defect-free region which is conventionally limited to N region can be expanded to I region, there can be easily and inexpensively provided a P-doped silicon single crystal having an excellent capability of electrical characteristics to be high breakdown voltage.

In this case, it is preferable that the growth of the single crystal is performed so that a P concentration is $1\times10^{14}$ atoms/cc or more in the silicon single crystal.

There can be sufficiently obtained a N-type of conductivity by performing the growth of the single crystal so that a P concentration is $1\times10^{14}$ atoms/cc or more in the silicon single crystal as described above.

In this case, it is preferable that in the growth of the single crystal, it is pulled so that a value of F/G (mm$^2$/° C.·min) is a value of 0.2 or less, where F (mm/min) is the pulling rate and G (° C./mm) is an average value of a temperature gradient in the crystal along a pulling axis from the melting point of silicon to 1400° C. Moreover, it is preferable that the crystal growth is performed in the range of N region and I region.

By pulling the single crystal so that a value of F/G (mm$^2$/° C.·min) is a value of 0.2 or less as described above, the single crystal growth can be performed, for example, in the range of N region and I region. Because I region becomes also defect-free in the P-doped silicon single crystal doped with Al in accordance with the present invention, there can be easily obtained the defect-free p-doped silicon single crystal in the above-described range.

Moreover, according to the present invention, there can be provided a P-doped silicon single crystal produced by the producing method as described above, and provided a silicon wafer which is sliced from the P-doped silicon single crystal.

There can be produced a high quality P-doped silicon single crystal at high productivity if a P-doped silicon-single crystal is produced by using the producing method of the present invention as described above. Therefore, the silicon wafer sliced from the P-doped silicon single crystal has high quality and becomes inexpensive.

Also, according to the present invention, there can be provided a P(phosphorus)-doped N-type silicon single crystal wafer wherein at least an Al (aluminum) concentration is $2\times10^{12}$ atoms/cc or more.

A P(phosphorus)-doped N-type silicon single crystal wafer wherein at least an Al(aluminum) concentration is $2\times10^{12}$ atoms/cc or more as described above can be obtained from a P-doped silicon single crystal in which a region at a lower rate side from N region is a defect-free I region containing no large dislocation clusters such as LFPD and LSEPD. Therefore, there can be easily and inexpensively provided a P-doped N-type silicon single crystal wafer having an excellent electrical characteristics to be high breakdown voltage.

In this case, it is preferable that a P concentration in the wafer is $1\times10^{14}$ atoms/cc or more.

There can be sufficiently obtained a N-type of conductivity if a P concentration in the wafer is $1\times10^{14}$ atoms/cc or more as described above.

In this case, it is preferable that the wafer is that the whole plane of the wafer is N region and/or I region.

If the wafer is that the whole plane of the wafer is N region and/or I region as described above, because I region is also defect-free in the P-doped N-type silicon single crystal wafer of the present invention, the wafer can be easily and inexpensively produced. And it can have an excellent electrical characteristics to be high breakdown voltage.

As explained above, according to the present invention, because I region becomes a defect-free region by doping the prescribed amount of aluminum when producing a P-doped silicon single crystal by Czochralski method, there can be provided a method of producing a P-doped silicon single crystal of N region and defect-free I region which contains neither, for example, V region, OSF region, nor large dislocation cluster (LSEPD, LFPD) region and which has an excellent capability of electrical characteristics to be high breakdown voltage, and there can be easily and inexpensively provided the P-doped N-type silicon single crystal wafer.

(a) Comparative example 3, (b) Comparative example 1, (c) Comparative example 2, (d) Example 1, Example 2.

Figure 2:
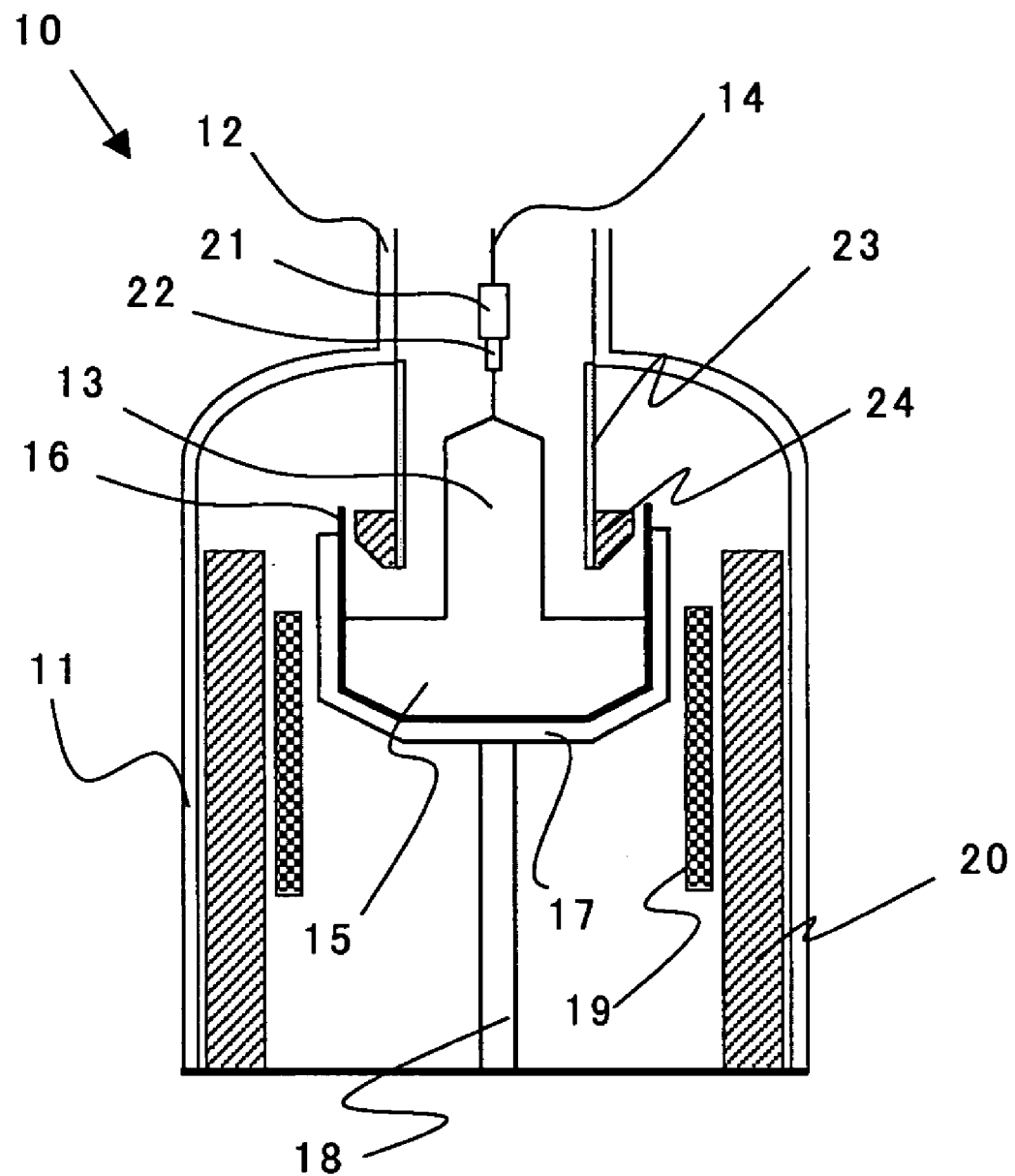

FIG. 2 is a schematic view of a single crystal production apparatus.

Figure 3:
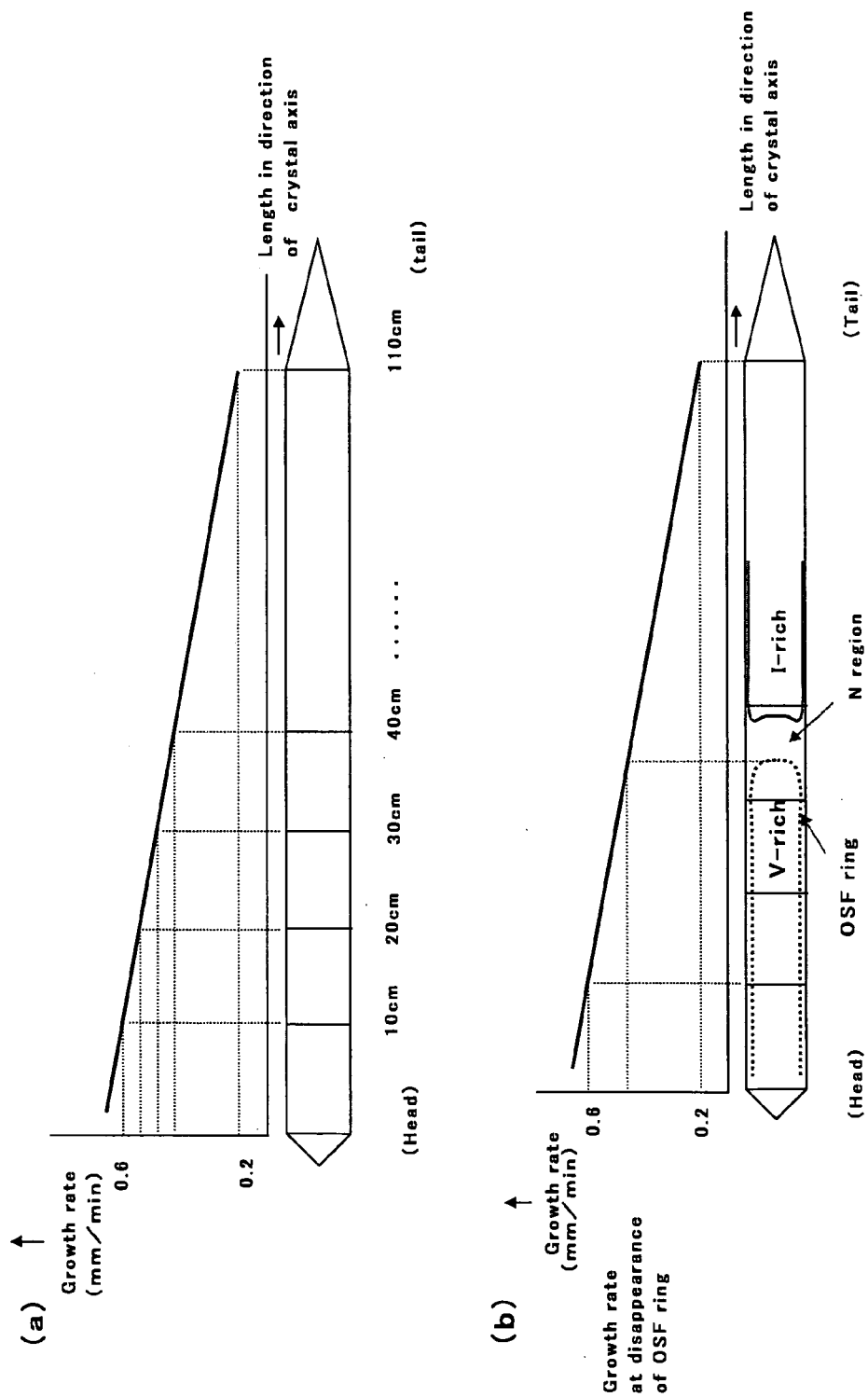

FIG. 3(a) is a view of showing relationship between a growth rate and crystal-sliced position of a silicon single crystal, and (b) is an explanatory view showing a growth rate and each region.

Figure 4:
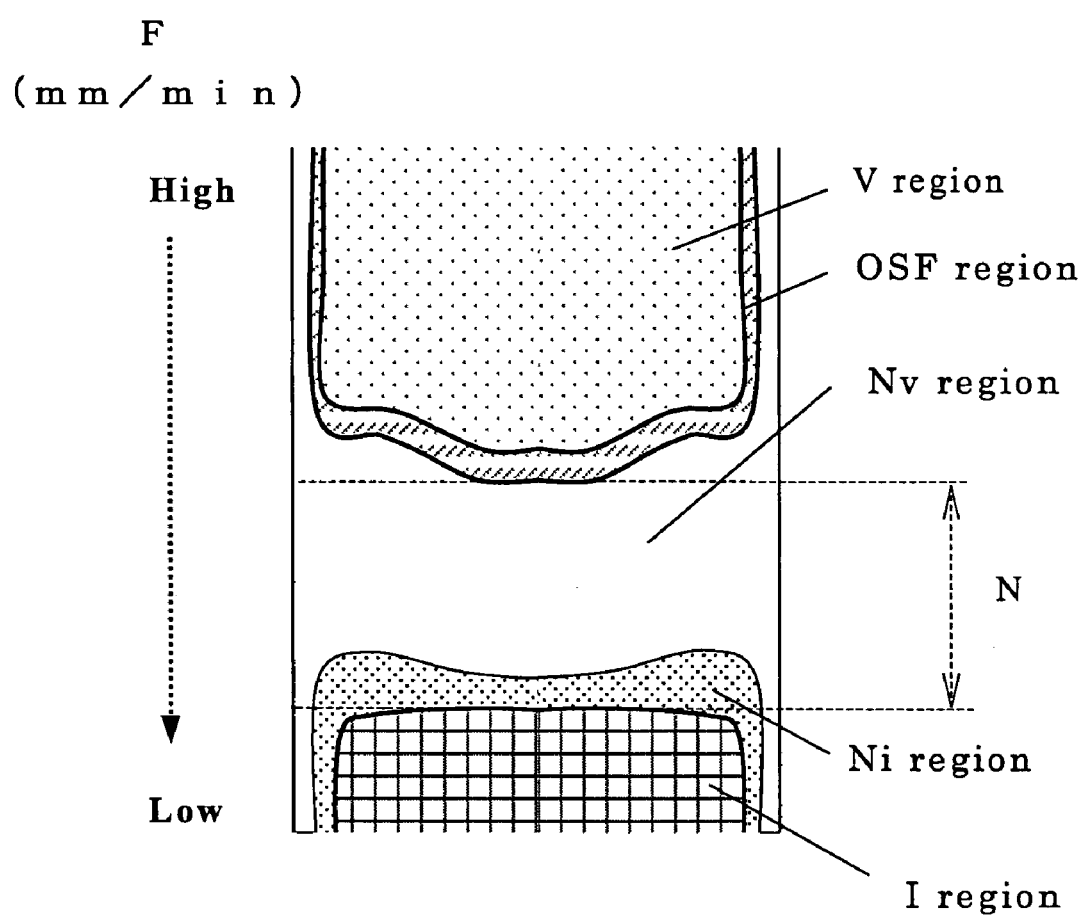

FIG. 4 is an explanatory view showing a relationship between a growth rate and a distribution of crystal defects according to a prior art.

BEST MODE FOR CARRYING OUT THE INVENTION

Hereinafter, embodiments of the present invention will now be described. However, the present invention is not limited thereto.

Here, a value of G (° C./mm), which is an average value of a temperature gradient in the crystal along a pulling axis from the melting point of silicon to 1400° C., is calculated by using the global heat transfer analysis software FEMAG.

FEMAG is the global heat transfer analysis software disclosed in the reference (F. Dupret, P. Nicodeme, Y. Ryckmans, P. Wouters, and M. J. Crochet, Int. J. Heat Mass Transfer, 33, 1849 (1990)).

Hereafter, the present invention will be described.

When producing B(Boron)-doped silicon single crystal by Czochralski method, if a growth rate of the single crystal is gradually decreased from high rate to low rate from a shoulder of the crystal through a tail of a straight body thereof, the OSF ring shrinks with reaching into one growth rate, and thereafter, in a lower rate region, each phase of N region (Nv and Ni region) and I region is formed in the order. Particularly in I region of a lower rate side from N region, it is known that large dislocation clusters of which size is about 10 μm or more are formed, and defects such as LSEPD and LFPD are present. In addition, in the case of B-doped silicon single crystal, N region is formed when a value of F/G (mm$^2$/° C. min) is in a range of 0.20–0.22.

On the other hand, when producing a P-doped silicon single crystal by Czochralski method, if a growth rate of a silicon single crystal is gradually decreased from high rate to low rate from a shoulder of the crystal through a tail of a straight body thereof, the OSF ring shrinks with reaching into one growth rate, and thereafter, in a lower rate region, each phase of N region (Nv, Ni region) and I region is formed in the order. In the large dislocation clusters agglomeration in the I region, LFPD isn't contained but only LSEPD is contained. In addition, in the case of P-doped silicon single crystal, N region is formed when a value of F/G (mm$^2$/° C.·min) is in a range of 0.18–0.20.

As described above, it was found that B-doped silicon single crystal and P-doped silicon single crystal had different behaviors of a distribution of crystal defects. Particularly from the difference in the way of generation of crystal defects in I region, in the case of P-doped silicon single crystal, the inventors found that Al elements taken in the pulling crystal after being eluted from natural quartz of a crucible suppressed generation of the large dislocation clusters which were normally confirmed in I region.

When pulling P-doped silicon single crystal, in the case of using a synthetic quartz crucible containing little Al components, the presence of the large dislocation clusters was confirmed in I region. However, when using such a natural quartz crucible that Al elements were taken in a pulling crystal in a concentration range of 5×10$^{11}$ atoms/cc or more and less than 2×10$^{12}$ atoms/cc, high density of LSEPD was confirmed in the I region of a little lower rate side from Ni region, but LSEPD was not formed in a further lower rate region. Namely, it was found that the region was defect-free I region. The present inventors examined Al concentration of I region in the vicinity of boundary where LSEPD disappeared. As a result, it was revealed that the concentration was about 2×10$^{12}$ atoms/cc, and at the time, a value of F/G (mm$^2$/° C.·min) in the boundary was 0.17.

And, the present inventors used a synthetic quartz crucible based on the above fact, and added refined Al metal grains when filling polycrystal silicon raw material so that Al elements of 2×10$^{12}$ atoms/cc or more could be taken in the pulling crystal. And, as a growth rate of a silicon single crystal was gradually decreased from high rate to low rate from a shoulder of the crystal through a tail of a straight body thereof, large dislocation clusters were not also formed in the I region of a little lower rate side from Ni region, which was defect-free, and the I region of a further lower rate side was also defect-free. Accordingly, it was found that in a P-doped crystal which is doped Al, N region and defect-free I region are formed in the region where F/G (mm$^2$/° C.·min) is 0.20, which is in the boundary between OSF and N region, or less.

In addition, because Al is a conductivity type element of P-type, it is necessary to be careful about a high concentration doping. Particularly in order to dope Al without a disadvantage for device design, it is desirable to control a concentration of Al taken in a crystal not to be more than 1×10$^{14}$ atoms/cc.

Moreover, it is preferable to dope P so that a P concentration in a P-doped silicon single crystal is 1×10$^{14}$ atoms/cc or more. This is because there can be obtained a sufficient N-type of conductivity if a concentration of doped P is 1×10$^{14}$ atoms/cc or more.

Hereafter, the present invention will be explained more specifically with reference to examples of the present invention and comparative examples. However, the present invention is not limited to these.

EXAMPLE 1

A silicon single crystal was produced by using a single crystal production apparatus as shown in FIG. 2. 150 kg of raw material polycrystal silicon and 4 mg of refined Al metal grains were charged in the quartz crucible with a diameter of 24 inches (600 mm), and a silicon single crystal with a diameter of 210 mm and orientation <100> was pulled. When pulling the silicon single crystal, a growth rate was controlled so as to be gradually decreased from a head of the crystal through a tail thereof in a range from 0.60 mm/min to 0.20 mm/min. Moreover, the silicon single crystal was produced so that a P concentration might be 3×10$^{14}$ to 5.5×10$^{14}$ atoms/cc and oxygen concentration might be 24–27 ppma (ASTM'79).

A straight body of each silicon single crystal ingot grown as described above was cut into blocks by each length of 10 cm along a crystal growth axis as shown in FIG. 3(a), and thereafter each block was cut longitudinally along the crystal axis and several samples with thickness of about 2 mm were produced.

As to the aforementioned samples, a distribution of each region of V region, OSF region, N region and I region (See, FIG. 3(b)), namely a distribution of FPD, LEPD, LSEPD or the like, and generation of OSF were measured by means of WLT measuring instrument (SEMILAB WT-85) and Secco etching, and a value of F/G (mm$^2$/° C.·min) in the boundary of each region was confirmed.

Specially, first, with respect to evaluation of FPD, LFPD, LSEPD, one of samples was subjected to a surface grinding, and then subjected to mirror etching and Secco etching (for 30 minutes), and left without stirring, and after a predetermined treatment, density of each defect was measured. Moreover, with respect to evaluation of OSF, one of the samples was subjected to heat treatment at 1150° C. for 100 minutes (under wet-oxidizing atmosphere) and then cooled down (set in and out at 800° C.), and after oxide film was removed by chemical solution, OSF ring pattern was confirmed and density thereof was measured.

Furthermore, slab samples being cut longitudinally along the crystal axis were cut to have a size of diameter of 200 mm. And the samples were finished to be a mirror state by polishing, and after an oxide thin film was formed on the wafer surface by pyrogenic oxidation at 900° C., heavy metals in the oxide film were collected by the thermal sulfuric acid, and Al concentration contained in the crystal bulk was identified from the measured value in the solution by WSA method.

More detailed distribution of each region which was found from the above-described measurement is shown in FIG. 1(d). F/G (mm$^2$/° C.·min) and an Al concentration in each region boundary are shown as follows.

F/G (mm$^2$/° C.·min) in the boundary between OSF region and N region: 0.20

F/G (mm$^2$/° C.·min) in the boundary between N region and (defect-free) I region: 0.18 an Al concentration in the crystal bulk near F/G=0.17: 4.1×10$^{12}$ atoms/cc.

EXAMPLE 2

A silicon single crystal was produced and each measurement was performed as the same with Example 1 except for charging 150 kg of raw material polycrystal silicon and 8 mg of refined Al metal grains in a quartz crucible.

More detailed distribution of each region which was found from the above-described measurement is shown in FIG. 1(d). F/G (mm²/° C.·min) and an Al concentration in each region boundary are shown as follows.

F/G (mm²/° C.·min) in the boundary between OSF region and N region: 0.20

F/G (mm²/° C.·min) in the boundary between N region and (defect-free) I region: 0.18 an Al concentration in the crystal bulk near F/G=0.17:8.8×10$^{12}$ atoms/cc.

COMPARATIVE EXAMPLE 1

A silicon single crystal was produced and each measurement was performed as the same with Example 1 except for charging 150 kg of raw material polycrystal silicon without Al metal grains in a quartz crucible.

More detailed distribution of each region which was found from the above-described measurement is shown in FIG. 1(b). F/G (mm²/° C.·min) and an Al concentration in each region boundary are shown as follows.

F/G (mm²/° C.·min) in the boundary between OSF region and N region: 0.20

F/G (mm²/° C.·min) in the boundary between N region and (large dislocation clusters-formed) I region: 0.18 an Al concentration in the crystal bulk near F/G=0.17:1× 10$^8$ atoms/cc.

COMPARATIVE EXAMPLE 2

A silicon single crystal was produced and each measurement was performed as the same with Example 1 except for charging 150 kg of raw material polycrystal silicon and 2 mg of refined Al metal grains in a quartz crucible.

More detailed distribution of each region which was found from the above-described measurement is shown in FIG. 1(c). F/G (mm²/° C.·min) and an Al concentration in each region boundary are shown as follows.

F/G (mm²/° C.·min) in the boundary between OSF region and N region: 0.20

F/G (mm²/° C.·min) in the boundary between N region and (large dislocation clusters-formed) I region: 0.18

F/G (mm²/° C.·min) in the boundary between (large dislocation clusters-formed) I region and (defect-free) I region: 0.17 an Al concentration in the crystal bulk near F/G=0.17: 1.8×10$^{12}$ atoms/cc.

COMPARATIVE EXAMPLE 3

A silicon single crystal was produced and each measurement was performed as the same with Example 1 except for charging 150 kg of raw material polycrystal silicon and 4 mg of refined Al metal grains in a quartz crucible and producing the silicon single crystal so that a B (Boron) concentration is 1×10$^{15}$–1.5×10$^{15}$ atoms/cc.

More detailed distribution of each region which was found from the above-described measurement is shown in FIG. 1(a). F/G (mm²/° C.·min) and an Al concentration in each region boundary are shown as follows.

F/G (mm²/° C.·min) in the boundary between OSF region and N region: 0.22

F/G (mm²/° C.·min) in the boundary between N region and (large dislocation clusters-formed) I region: 0.20 an Al concentration in the crystal bulk near F/G=0.17: 3.8×10$^{12}$ atoms/cc.

Figure 1:
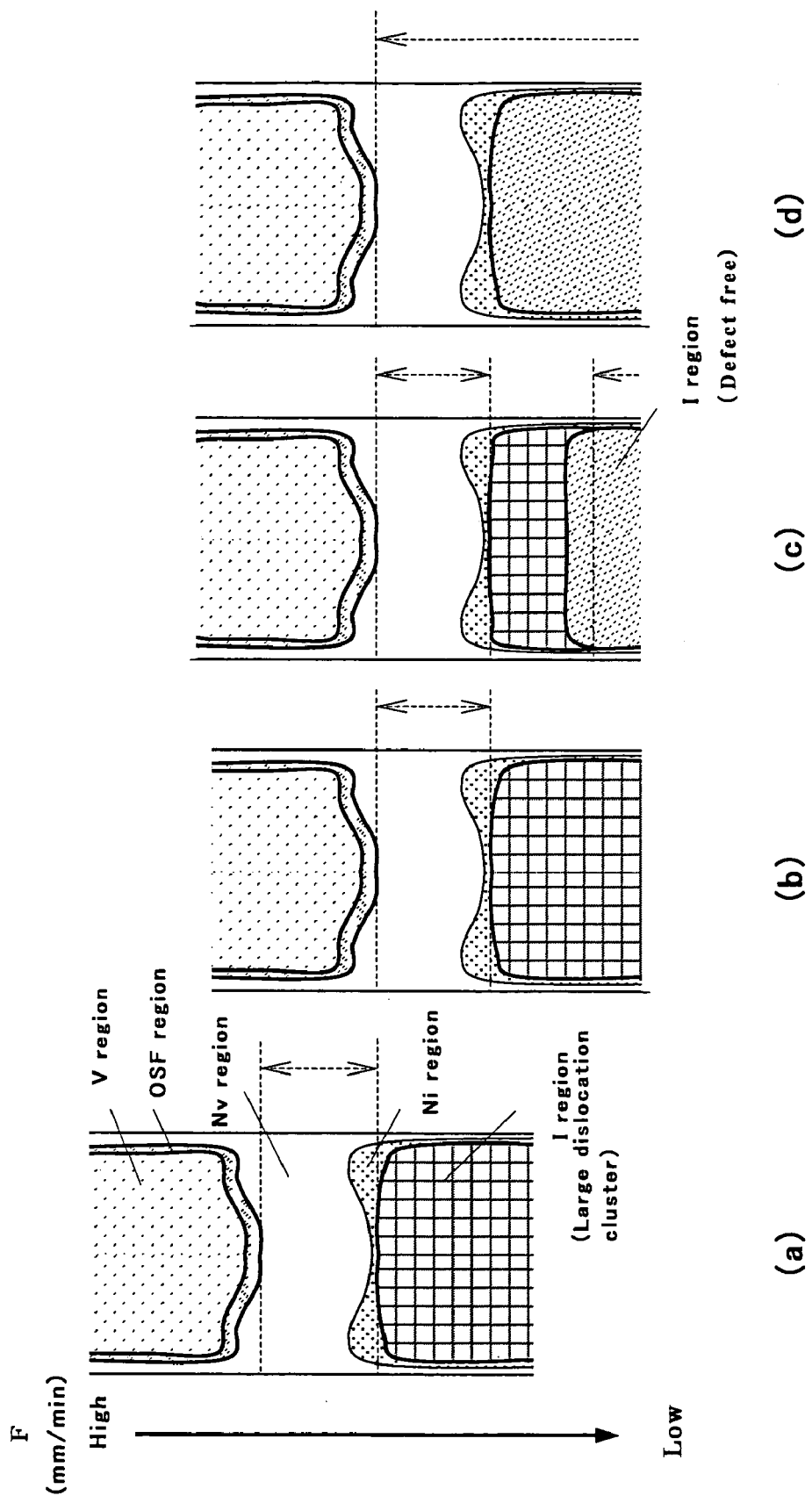
FIG. 1 is an explanatory view showing a relationship between a growth rate and a distribution of crystal defects under each condition.

As clear from FIG. 1, in the case of P-doped silicon single crystal, in Comparative example 1 and Comparative example 2 where an Al concentration contained less than 2×10$^{12}$ atoms/cc, large dislocation clusters were formed in I region, and even if defect-free I region was present, it existed in only one portion (FIG. 1(b), (c)). However, in Example 1 and Example 2 where an Al concentration contained 2×10$^{12}$ atoms/cc or more, I region became defect-free as shown FIG. 1(d), and the whole plane at the lower rate side from the boundary between OSF and N region became defect-free region.

On the other hand, in the case of B-doped silicon single crystal, as Comparative example 3, even if an Al concentration is 2×10$^{12}$ atoms/cc or more, large dislocation clusters were formed in I region as shown in FIG. 1(a), and defect-free I region was not present.

In addition, the present invention is not limited to the embodiments described above. The above-described embodiments were examples, and those having the substantially same constitution as that described in the appended claims and providing the similar working effects are included in the scope of the present invention.

The invention claimed is:

1. A P(phosphorus)-doped N-type silicon single crystal wafer wherein at least an Al (aluminum) concentration is 2×10$^{12}$ atoms/cc or more, and wherein the whole plane of the wafer is N region and/or I region.

2. The P-doped N-type silicon single crystal wafer according to claim 1 wherein a P concentration in the wafer is 1×10$^{14}$ atoms/cc or more.

3. A method of producing a P(phosphorus)-doped silicon single crystal by Czochralski method, wherein, at least, a growth of the single crystal is performed so that an Al (aluminum) concentration is 2×10$^{12}$ atoms/cc or more, and wherein the crystal growth is performed in the range of N region and I region.

4. The method of producing a P-doped silicon single crystal according to claim 3, wherein the growth of the single crystal is performed so that a P concentration is 1×10$^{14}$ atoms/cc or more in the silicon single crystal.

5. The method of producing a P-doped silicon single crystal according to claim 4, wherein in the growth of the single crystal, it is pulled so that a value of F/G (mm²/° C.·min) is a value of 0.2 or less, where F (mm/mm) is the pulling rate and G (° C./mm) is an average value of a temperature gradient in the crystal along a pulling axis from the melting point of silicon to 1400° C.

6. A P-doped silicon single crystal produced by the method according to claim 5.

7. A silicon wafer which is sliced from the P-doped silicon single crystal according to claim 6.

8. A P-doped silicon single crystal produced by the method according to claim 4.

9. A silicon wafer which is sliced from the P-doped silicon single crystal according to claim 8.

10. The method of producing a P-doped silicon single crystal according to claim 3, wherein in the growth of the single crystal, it is pulled so that a value of F/G (mm²/° C.·min) is a value of 0.2 or less, where F (mm/min) is the pulling rate and G (° C./mm) is an average value of a temperature gradient in the crystal along a pulling axis from the melting point of silicon to 1400° C.

11. A P-doped silicon single crystal produced by the method according to claim 10.

12. A silicon wafer which is sliced from the P-doped silicon single crystal according to claim 11.

13. A P-doped silicon single crystal produced by the method according to claim 3.

14. A silicon wafer which is sliced from the P-doped silicon single crystal according to claim 13.

* * * * *